United States Patent
Shih et al.

(10) Patent No.: US 7,277,285 B2
(45) Date of Patent: *Oct. 2, 2007

(54) HEAT DISSIPATION MODULE

(75) Inventors: Jung-Sung Shih, Taoyuan Hsien (TW); Wei-Fang Wu, Taoyuan Hsien (TW); Yu-Hung Huang, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 231 days.

This patent is subject to a terminal disclaimer.

(21) Appl. No.: 11/097,323

(22) Filed: Apr. 4, 2005

(65) Prior Publication Data

US 2005/0225943 A1 Oct. 13, 2005

(30) Foreign Application Priority Data

Apr. 7, 2004 (TW) .............................. 93109597 A

(51) Int. Cl.
 H05K 7/20 (2006.01)
(52) U.S. Cl. ................................. 361/700
(58) Field of Classification Search ............. 361/700, 361/704, 697, 699; 165/104.33, 104.21, 165/104.26, 80.4; 174/15.1, 15.2; 439/487; 257/714, 715, 716
See application file for complete search history.

(56) References Cited

U.S. PATENT DOCUMENTS

| | | | | |
|---|---|---|---|---|
| 4,516,631 A | * | 5/1985 | Russell | 165/47 |
| 4,554,966 A | * | 11/1985 | Vasiliev et al. | 165/104.21 |
| 6,418,017 B1 | * | 7/2002 | Patel et al. | 361/700 |
| 6,591,897 B1 | * | 7/2003 | Bhatti et al. | 165/80.3 |
| 6,914,769 B2 | * | 7/2005 | Welsch et al. | 361/508 |
| 7,013,956 B2 | * | 3/2006 | Thayer et al. | 165/104.25 |
| 7,128,134 B2 | * | 10/2006 | Shih et al. | 165/104.26 |
| 2003/0194345 A1 | * | 10/2003 | Loewen | 422/9 |
| 2005/0077618 A1 | * | 4/2005 | McCutcheon et al. | 257/712 |
| 2005/0211419 A1 | * | 9/2005 | Shih et al. | 165/104.26 |
| 2006/0090882 A1 | * | 5/2006 | Sauciuc | 165/104.26 |
| 2006/0196640 A1 | * | 9/2006 | Siu | 165/104.26 |
| 2007/0068654 A1 | * | 3/2007 | Chang | 165/104.21 |

* cited by examiner

*Primary Examiner*—Chandrika Prasad
(74) *Attorney, Agent, or Firm*—Birch, Stewart, Kolasch & Birch, LLP

(57) ABSTRACT

The invention discloses a heat dissipation module. The heat dissipation module includes two separate cases and a porous structure. The cases are U-shaped and correspondingly connect to each other to form a sealed chamber. The porous structure is formed on an inner surface of the chamber. The heat dissipation module further includes at least one heat conducting structure connected to an exterior surface of the sealed chamber. The heat conducting structure may be fins or heat conducting plates connected to the chamber by welding, locking, fitting, engaging, or adhering.

18 Claims, 9 Drawing Sheets

HEAT DISSIPATION MODULE

BACKGROUND OF THE INVENTION

1. Field of the Invention

The invention relates to a heat dissipation module and in particular to a faster and more efficient heat dissipation module.

2. Brief Discussion of the Related Art

Precision electrical components often generate excess heat which cannot be dissipated by natural or forced convection. For accelerated dissipation of heat from the electrical components, a heat sink is typically disposed on heat sources, with heat dissipated more thoroughly via fins thereof.

Heat sinks using fans still have limitations dissipating heat rapidly. For example, the temperature difference of the airflow between the surfaces of fins and the heat sink is only 5-10° C., whereby insufficient temperature gradient and heat resistance generated by the material and structure of the heat sink may reduce the heat dissipation efficiency of the fins below 70%. Thus, the typical heat sink is limited in heat dissipation efficiency.

FIG. 1 shows a conventional heat dissipation module 100. The heat dissipation module 100 includes an angled heat pipe 102 and a plurality of fins 104, 106. An inner surface of the heat pipe 102 is created a wicking structure. Heat is transmitted from a heat source via the heat pipe 102 to the fins 104 and 106, and dissipated by convection.

The heat pipe 102 is sintered to create the wicking structure on the inner surface thereof, and formed in an M-shape, and the ends thereof sealed. During shaping, the sintered wicking structure on the bent portions may be destroyed, lessening the capillarity thereof and reducing the heat dissipation ability.

Furthermore, due to limited contact area between the heat pipe 102 and the heat source, and high heat resistant material required as a welding layer between the heat pipe 102 and the heat source, the heat conducting ability of the heat pipe 102 may be further compromised.

Moreover, the shape of the contact area between the heat pipe 102 and the heat source varies with the type of heat source, requiring the wall of the heat pipe 102 to be varied thickness, increasing the cost of material and weight of the heat dissipation module.

SUMMARY OF THE INVENTION

Embodiments of the invention provide a heat dissipation module comprising two separate cases and a porous structure. The cases are U-shaped and correspondingly connect to each other to form a sealed chamber. The porous structure is formed on an inner surface of the chamber.

The cases may be polygonal or a spiral-shaped case, with a heat absorption region corresponding to a heat source. The cases may comprise a body and a base, integrally formed or detachable. The body has an opening disposed on the interface of the body and the base. At least one end portion is disposed on the underside of the cases, the end portions narrowing outward.

In the embodiments, the porous structure may contain liquid. The porous structure may be plastic, metal, alloy, or nonmetallic material. The porous structure may be wick, mesh, fiber, sinter, or be grooved. The porous structure and the sealed chamber are connected by sintering, adhering, filling, or deposition.

The heat dissipation module further comprises at least one heat conducting structure connected to an exterior surface of the sealed chamber. The heat conducting structure may be fins or heat conducting plates connected to the chamber by welding, locking, fitting, engaging, or adhering.

In the embodiments, the cases may respectively comprise a heat absorption region corresponding to the shape of the heat source, thereby achieving maximum contact between the cases and the heat source and improving heat dissipation efficiency.

Moreover, the heat dissipation module contacts the heat source via the detachable base, without affecting heat dissipation efficiency, with no welding layer.

The number of cases in the heat dissipation module can vary with demand.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE PREFERRED EMBODIMENTS

First Embodiment

Figure 1:
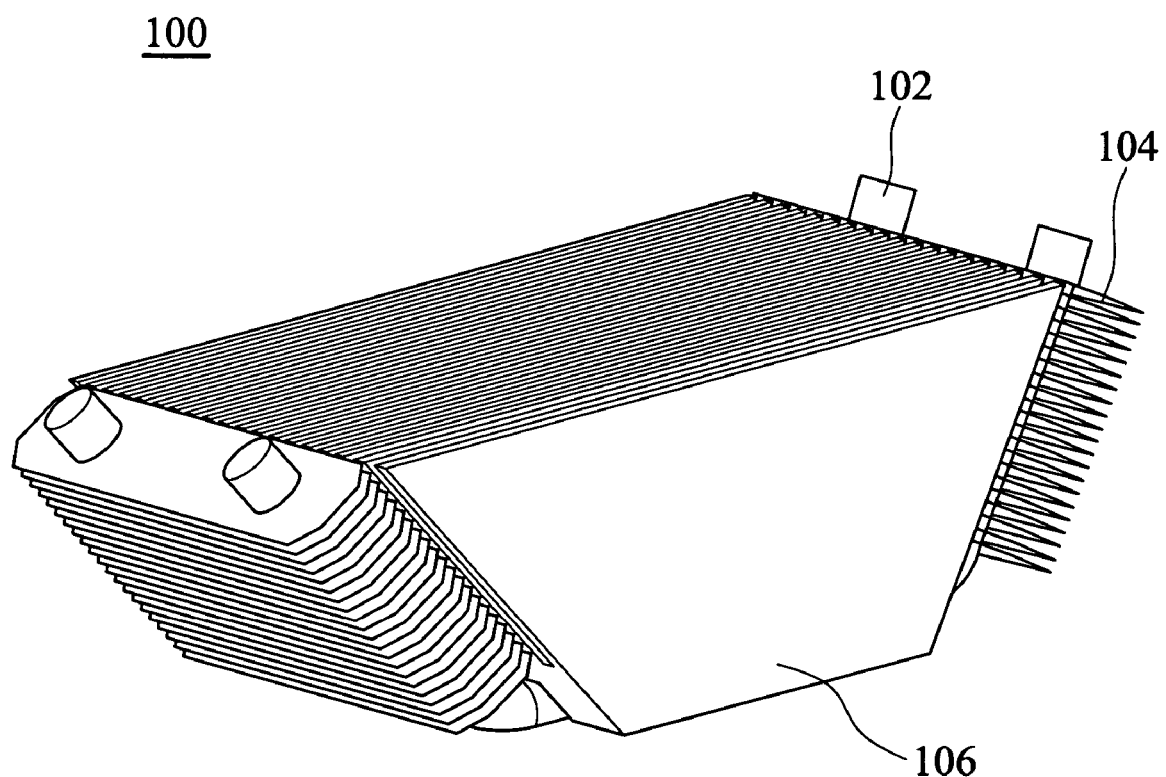
FIG. 1 is a schematic view of a conventional heat dissipation module.
Figure 2A:
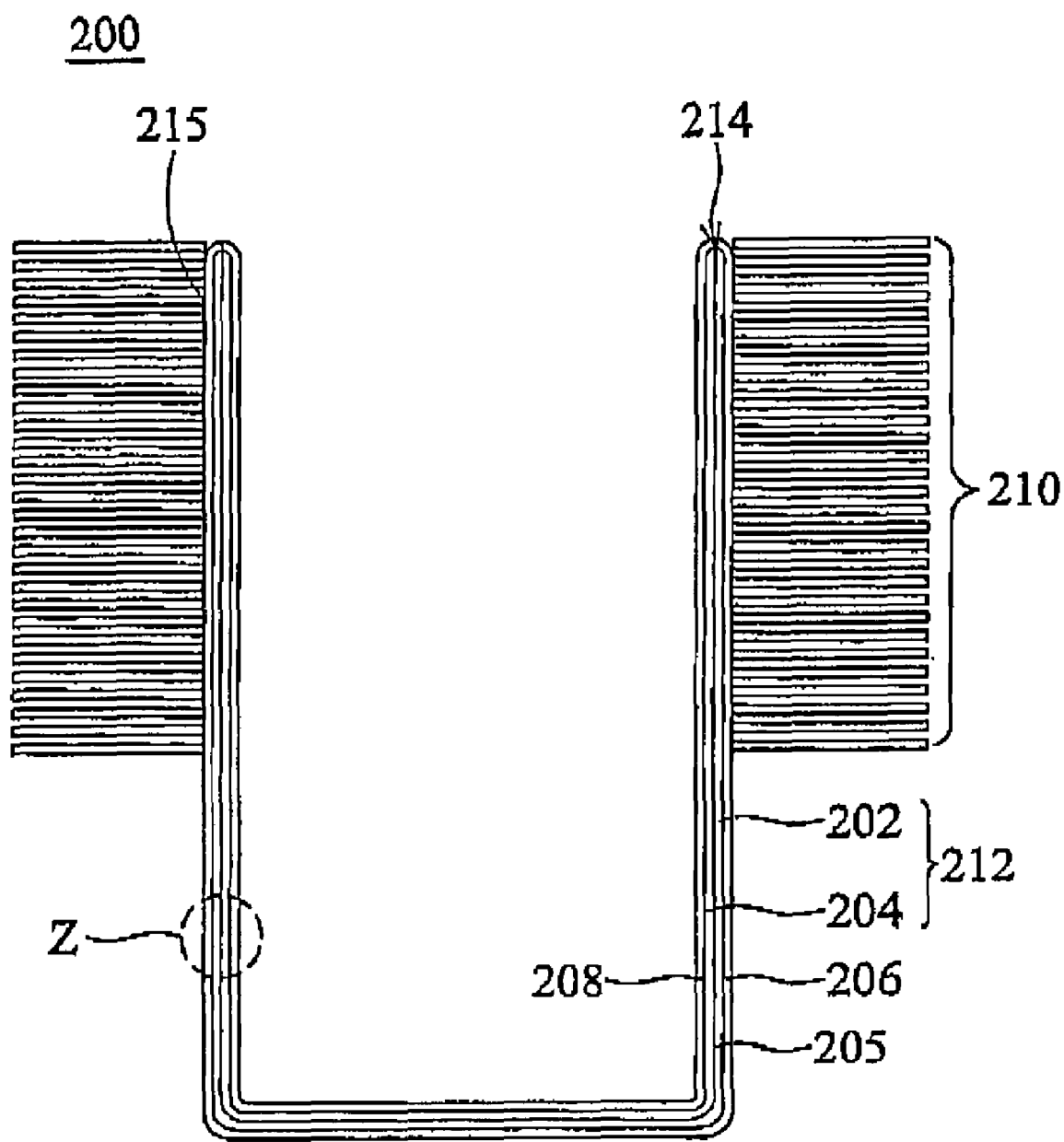
FIG. 2A is a schematic view of a heat dissipation module of a first embodiment of the invention.
Figure 2B:
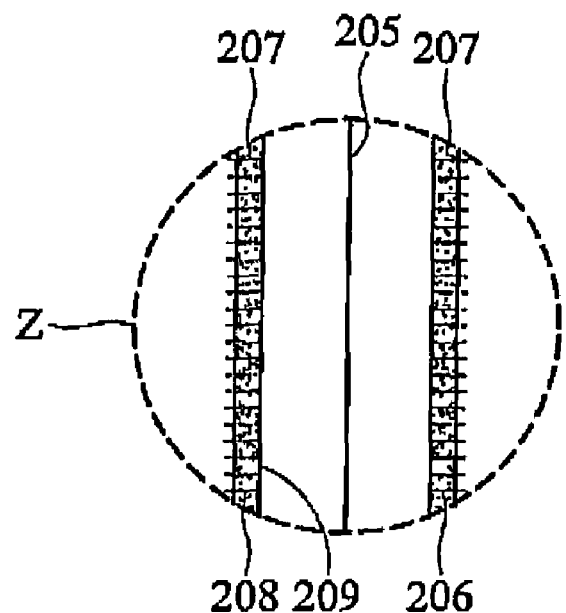
FIG. 2B is an enlarged view of part Z shown in FIG. 2A wherein the porous structure is mesh.
Figure 2C:
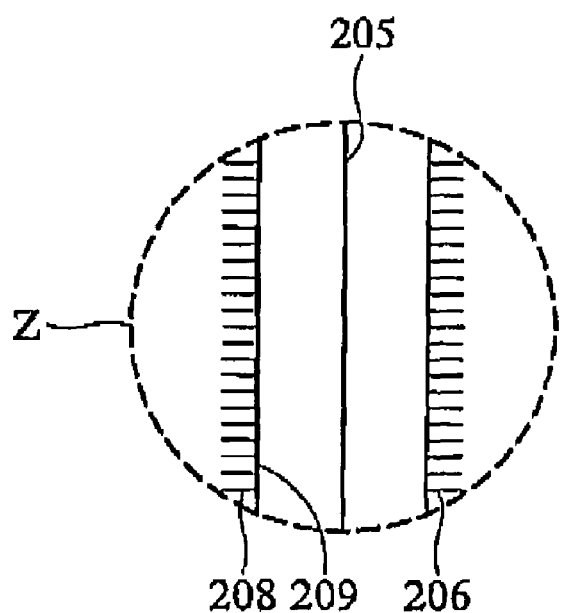
FIG. 2C is an enlarged view of part Z shown in FIG. 2A wherein the porous structure is fiber.
Figure 2D:
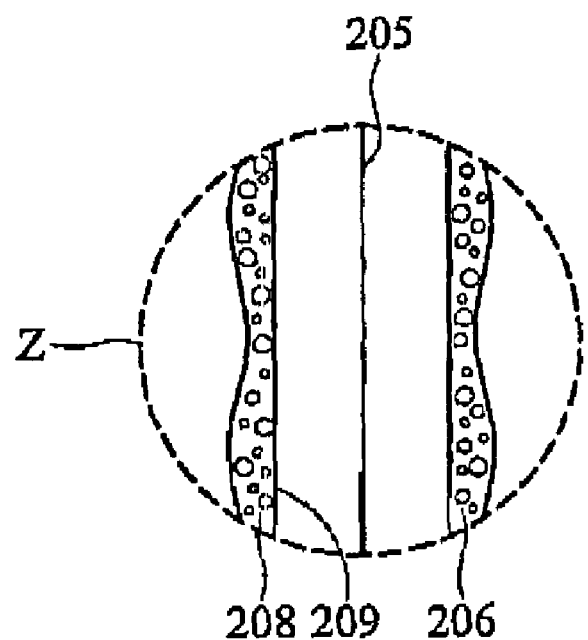
FIG. 2D is an enlarged view of part Z shown in FIG. 2A wherein the porous structure is sintered.
Figure 2E:
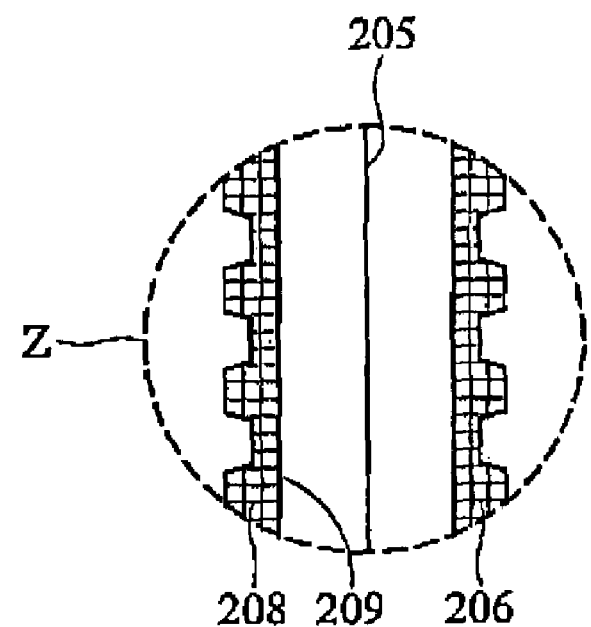
FIG. 2E is an enlarged view of part Z shown in FIG. 2A wherein the porous structure is groove.

FIG. 2A is a schematic view of a heat dissipation module 200 of a first embodiment of the invention. FIG. 2B is an enlarged view of part Z shown in FIG. 2A wherein the porous structure is mesh. FIG. 2C is an enlarged view of part Z shown in FIG. 2A wherein the porous structure is fiber. FIG. 2D is an enlarged view of part Z shown in FIG. 2A wherein the porous structure is sintered. FIG. 2E is an enlarged view of part Z shown in FIG. 2A wherein the porous structure is groove. The heat dissipation module 200 comprises a heat conducting structure 210 and cases 202 and 204.

The cases 202 and 204 are detachable and correspond to each other. The shape of the cases 202 and 204 can vary with demand, such as U-shaped or corresponding to the shape of the heat source. Porous structures 206 and 208 are formed on inner surfaces of cases 202 and 204. The cases 202 and 204 are connected to form a sealed chamber 212, acting as a vapor chamber 214. The cases 202 and 204 can be connected by welding (or locking, fitting, engaging, adhering) 205, and may be metal cases.

The porous structures 206 and 208 are disposed in the sealed chamber 212, and impregnated with liquid 207 to conduct heat. The liquid may be an inorganic compound, water, alcohol, liquid metal (such as mercury), ketone, refrigerant (such as HFC-134a), or organic compound. The boiling point of the liquid is controlled by pressure in the vapor chamber 214. The porous structures 206 and 208 may be wick, mesh, fiber, sintered, or grooved. The porous structures 206 and 208 and the sealed chamber 212 are connected by sintering (or adhering, filling, deposition) 209. The porous structures 206 and 208 are plastic, metal or alloy comprising copper, aluminum, or iron, or porous nonmetallic material. Further, in a modified instance, the porous structures may be disposed on only one case.

The heat conduction structure 210 is disposed on two sides of the sealed chamber 212 to dissipate the heat from the sealed chamber 212. The heat conducting structure 210 may be fins or heat conducting plates. The heat conducting structure 210 is connected to the sealed chamber 212 by welding (or locking, fitting, engaging, adhering) 215. In addition, the heat conducting structure 210 may be attached to the edge of the sealed chamber 212 or around the sealed chamber 212.

The cases 202 and 204 can be preformed before the porous structures 206 and 208 are created and attached to the inner surface thereof. The porous structures 206 and 208 remain intact during case formation, such that heat dissipation efficiency is improved.

Figure 3A:
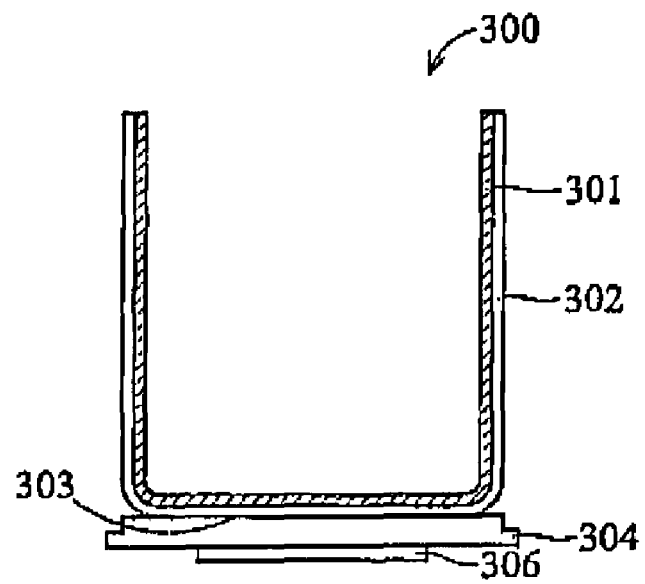
FIG. 3A is a sectional diagram of cases of embodiments of the invention.
Figure 3B:
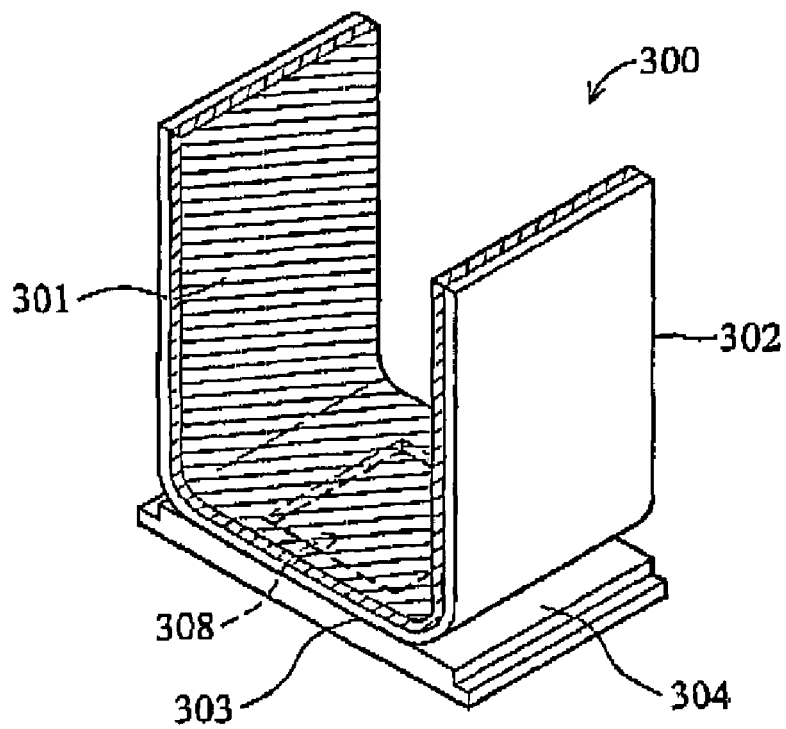
FIG. 3B is a perspective view of the case shown in FIG. 3A.

FIGS. 3A and 3B show other cases of the invention. In FIGS. 3A and 3B, the case 300 is a variation of the case 202, and comprises a body 302 contacting heat source 306 via a base 304. Porous structures 301 are formed on sidewall of the body 302. The body 302 provides an opening 308 on an interface contacting with the base 304. The profile of the base 304 corresponds to the type of the heat source 306, and is firmly connected thereto. The body 302 is attached to the base 304 by welding (or locking, fitting, engaging, adhering) 303, or is integral therewith.

Figure 3C:
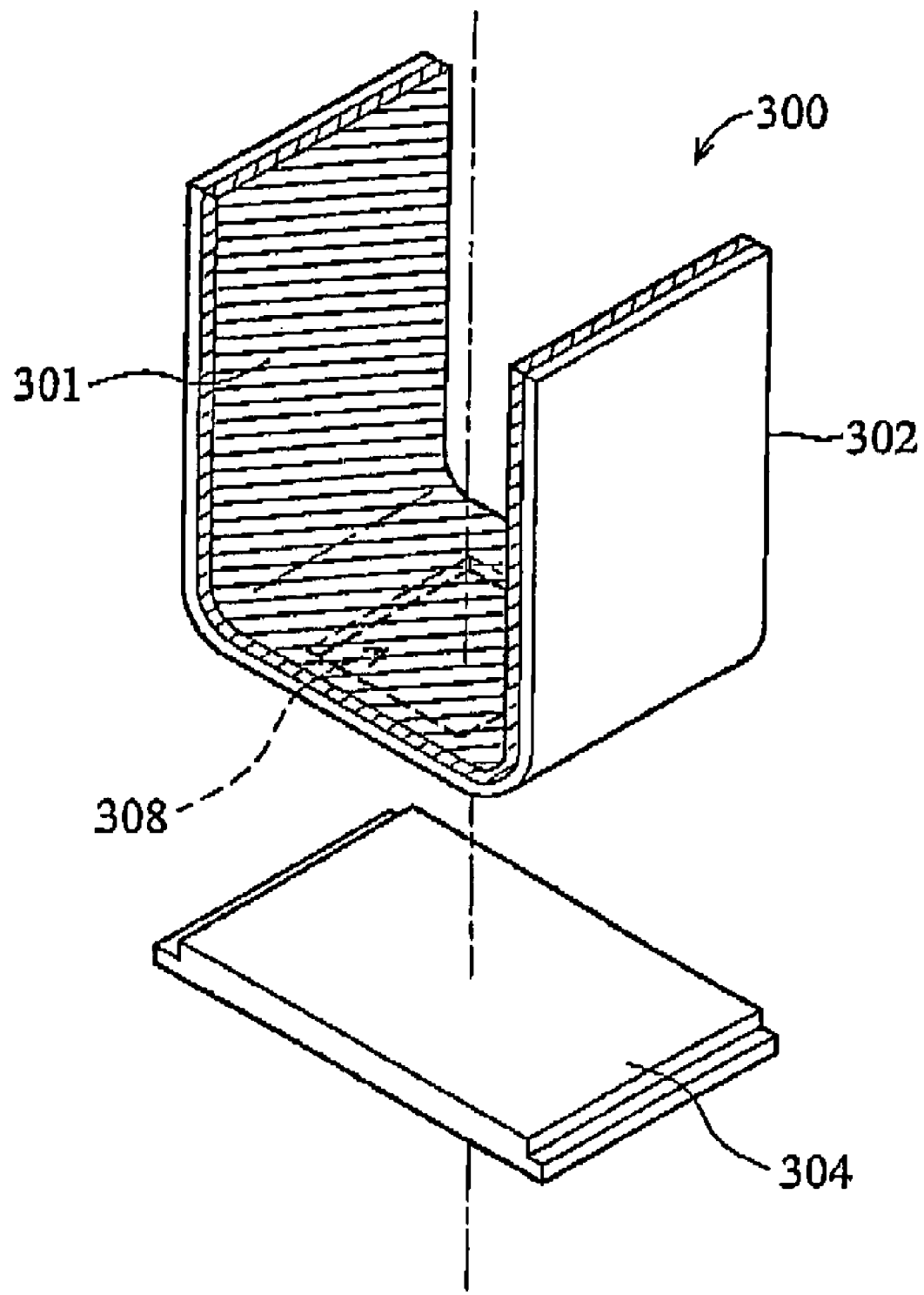
FIG. 3C shows a body detachable from a base.

FIG. 3C shows a body detachable from a base. The base 30 and the body 302 can separate to each other. Thickness of the base 304 and the body 302 may be different such that thickness of the base 304 may be the same as the case of a conventional heat sink for easier manufacture, and the thickness of the body 302 reduced, decreasing the cost of material and the weight of the heat dissipation module.

The connection between the body 302 and base 304, at the edge of the base 304, does not influence heat dissipation efficiency.

Figure 4:
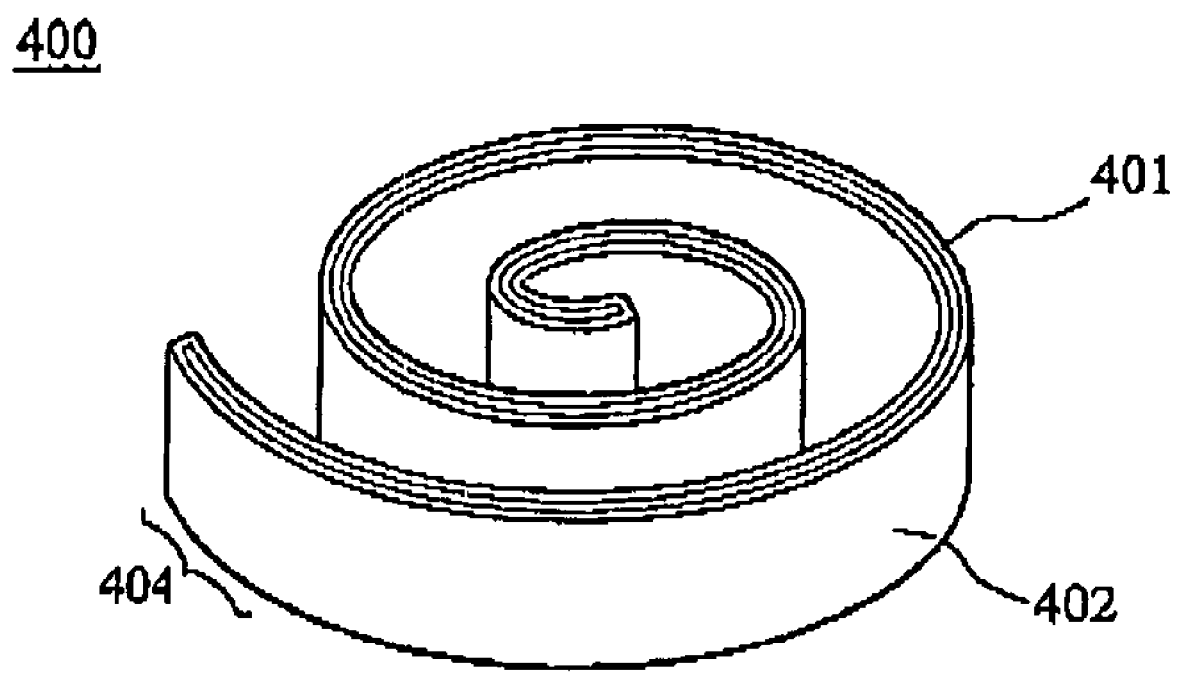
FIG. 4 shows case of another embodiment of the invention.

Although the cases described are U-shaped, a case 400 may be a spiral-shaped case 402 with a heat absorption region 404 corresponding to a heat source as shown in FIG. 4. The cases may also be polygonal or irregularly shape. Porous structures 401 are formed on sidewall of the case 402.

Second Embodiment

Figure 5:
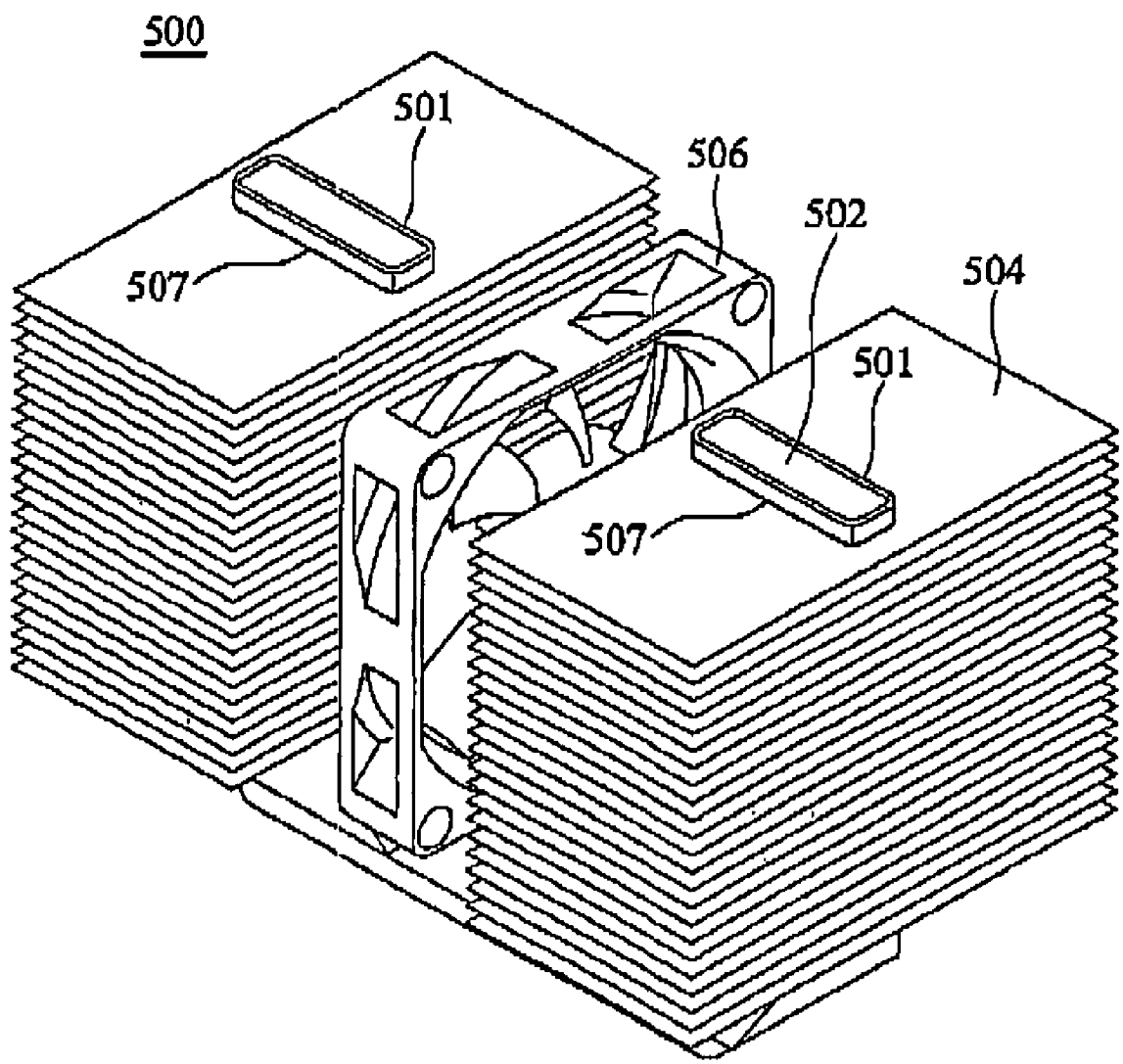
FIG. 5 is a schematic view of a heat dissipation module of a second embodiment of the invention.

FIG. 5 is schematic view of a heat dissipation module 500 of a second embodiment of the invention. Porous structures 501 are formed on side surface of the case 502. The heat conducting structure 504 is connected to the case 502 by welding (or locking, fitting, engaging, adhering) 507. In this embodiment, the cross-sections of the ends of the case 502 are perpendicular to the cross-sections of the heat absorption region, and the heat conducting structure 504 surrounds the ends of the case 502. Furthermore, a fan 506 is disposed between two ends of the case 502, enhancing the convection ability of heat dissipation module 500, with heat dissipation efficiency thereof increased over heat dissipation module 200.

Third Embodiment

Figure 6:
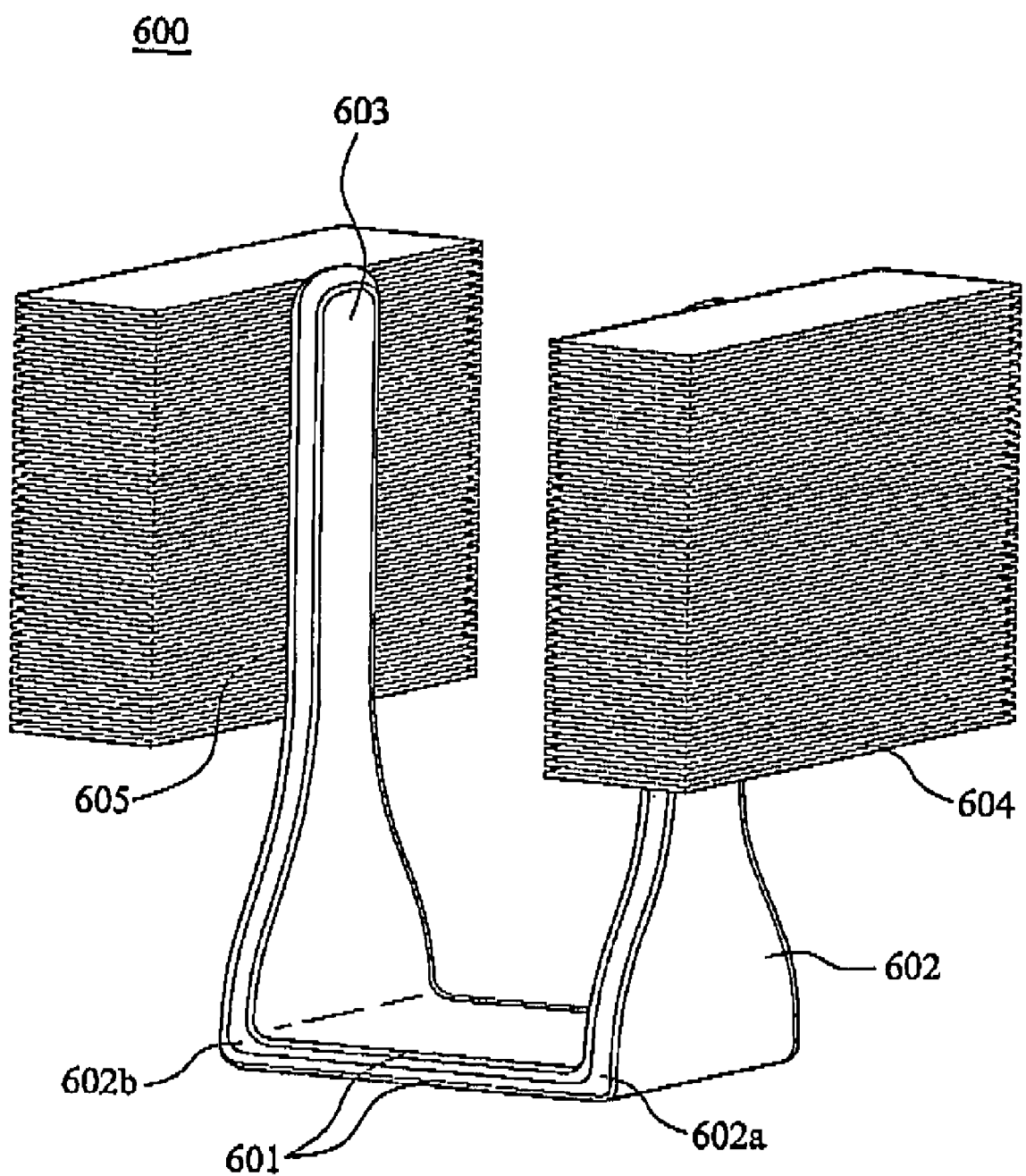
FIG. 6 is schematic view of a heat dissipation module of a third embodiment of the invention.

FIG. 6 is schematic view of a heat dissipation module 600 of a third embodiment of the invention. The case assembly 602 is composed of the case 602a and case 602b, both of which may be polygonal as shown in FIG. 6. Porous structures 601 are formed on the sidewall of the cases 602a and 602b. In this embodiment, at least one end portion 603 of the heat absorption region of the case 602 protrudes, and narrows outward. The heat conducting structure 604 is connected to the end portion of the case 602 by welding (or locking, fitting, engaging, adhering) 605. Due to the shape of the end portion, cost of materials and weight of the case 602 may be reduced.

Accordingly, the cases and the porous structure disposed on the inner surface thereof require no secondary manufacture, with the porous structure protected during formation.

The cases may respectively have a heat absorption region corresponding to the shape of the heat source, increasing the contact region between the cases and the heat source and improving heat dissipation efficiency.

Moreover, the heat dissipation module contacts the heat source via the detachable base, without affecting heat dissipation efficiency, with no welding layer.

The number of cases in the heat dissipation module can vary with demand.

Finally, the heat dissipation module contacts the heat source via the detachable base. The main requirement of the heat dissipation module is that the thickness of the base should be adequate for manufacturing process, and the thickness of the body may be decreased. Thus, the cost of material and the weight of the heat dissipation module may be reduced.

While the invention has been described by way of example and in terms of preferred embodiments, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation module, comprising:
   a first case;
   a second case corresponding to and connected to the first case to create a sealed chamber; and
   a porous structure disposed on an inner surface of the sealed chamber, wherein the first case and the second case are U-shaped, polygonal structure, or a spiral-shaped case having a heat absorption region corresponding to a heat source.

2. The beat dissipation module as claimed in claim 1, wherein the sealed chamber acts as a vapor chamber.

3. The bleat dissipation module as claimed in claim 1, wherein the porous structure is impregnated with liquid.

4. The heat dissipation module as claimed in claim 3, wherein the liquid comprises an inorganic compound, waters alcohol, liquid metal, ketone, refrigerant, or organic compound.

5. The heat dissipation module as claimed in claim 1, wherein the porous structure is plastic, metal, alloy, or nonmetallic material.

6. The heat dissipation module as claimed in claim 1, wherein the first case and the second case are connected by welding, locking, fitting, engaging, or adhering.

7. The heat dissipation module as claimed in claim 1, wherein the porous structure is a mesh, fiber, sintered, or grooved.

8. The heat dissipation module as claimed in claim 1, wherein the porous structure is a wick structure.

9. The heat dissipation module as claimed in claim 1, wherein the porous structure and the sealed chamber are connected by sintering, adhering, filling, or deposition.

10. The heat dissipation module as claimed in claim 1, wherein the first case comprises a body and a base.

11. The heat dissipation module as claimed in claim 10, wherein the body is detachable from the base.

12. The beat dissipation module as claimed in claim 10, wherein the body has an opening on an interface between the body and the base.

13. The heat dissipation module as claimed in claim 10, wherein the body is attached to the base by welding, locking, fitting, engaging, adhering, or integrated form.

14. The heat dissipation module as claimed in claim 1, wherein at least one end portion is respectively disposed on the undersides of the first case and the second case, with the end portions narrowing outward.

15. The heat dissipation module as claimed in claim 1, wherein the first case and/or the second case respectively comprise a heat absorption region corresponding to the heat source.

16. The heat dissipation module as claimed in Claim 1, further comprising a heat conducting structure connected to an exterior surface of the chamber.

17. The heat dissipation module as claimed in claim 16, wherein the heat conducting structure comprises fins or heat conducting plates.

18. The heat dissipation module as claimed in claim 16, wherein the heat conducting structure is connected to the sealed chamber by welding, locking, fitting, engaging, or adhering.

* * * * *